US012604752B2

(12) United States Patent
Fürgut et al.

(10) Patent No.: US 12,604,752 B2
(45) Date of Patent: Apr. 14, 2026

(54) SEMICONDUCTOR DIE PACKAGE

(71) Applicant: Infineon Technologies Austria AG, Villach (AT)

(72) Inventors: Edward Fürgut, Dasing (DE); Irmgard Escher-Poeppel, Duggendorf (DE); Martin Gruber, Schwandorf (DE); Ivan Nikitin, Regensburg (DE); Hans-Joachim Schulze, Taufkirchen (DE)

(73) Assignee: Infineon Technologies Austria AG, Villach (AT)

( * ) Notice: Subject to any disclaimer, the term of this patent is extended or adjusted under 35 U.S.C. 154(b) by 228 days.

(21) Appl. No.: 18/132,629

(22) Filed: Apr. 10, 2023

(65) Prior Publication Data

US 2023/0282608 A1 Sep. 7, 2023

Related U.S. Application Data

(62) Division of application No. 17/149,891, filed on Jan. 15, 2021, now Pat. No. 11,688,713.

(30) Foreign Application Priority Data

Jan. 20, 2020 (EP) .................................... 20152722

(51) Int. Cl.
*H01L 23/00* (2006.01)
*H01L 21/56* (2006.01)
(Continued)

(52) U.S. Cl.
CPC .............. *H01L 24/35* (2013.01); *H01L 24/37* (2013.01); *H01L 21/56* (2013.01); *H01L 23/3107* (2013.01); *H01L 23/485* (2013.01);

*H01L 23/495* (2013.01); *H01L 24/03* (2013.01); *H01L 24/04* (2013.01); *H01L 24/05* (2013.01);
(Continued)

(58) Field of Classification Search
CPC ...................................................... H01L 23/34
See application file for complete search history.

(56) References Cited

U.S. PATENT DOCUMENTS 4,404,453 A * 9/1983 Gotman ............... B23K 1/0056
257/E21.511
5,164,566 A * 11/1992 Spletter ................ B23K 1/0056
219/121.63
(Continued)

FOREIGN PATENT DOCUMENTS

CN 107039337 A 8/2017
CN 107275235 A 10/2017
(Continued)

OTHER PUBLICATIONS https://www.dictionary.com/browse/block (definition 1).*

*Primary Examiner* — David A Zarneke
(74) *Attorney, Agent, or Firm* — Murphy, Bilak & Homiller, PLLC

(57) ABSTRACT

A semiconductor die package includes a semiconductor transistor die having a contact pad on an upper main face. The semiconductor die package also includes an electrical conductor disposed on the contact pad and fabricated by laser-assisted structuring of a metallic material, and an encapsulant covering the semiconductor die and at least a portion of the electrical conductor.

18 Claims, 6 Drawing Sheets

100

(51) Int. Cl.

| | |
|---|---|
| *H01L 23/31* | (2006.01) |
| *H01L 23/485* | (2006.01) |
| *H01L 23/495* | (2006.01) |

(52) U.S. Cl.

CPC ...... *H01L 24/06* (2013.01); *H01L 2224/0312* (2013.01); *H01L 2224/03442* (2013.01); *H01L 2224/03502* (2013.01); *H01L 2224/03848* (2013.01); *H01L 2224/05575* (2013.01); *H01L 2224/0558* (2013.01); *H01L 2224/05582* (2013.01); *H01L 2224/06181* (2013.01); *H01L 2224/35848* (2013.01); *H01L 2224/35986* (2013.01); *H01L 2224/37005* (2013.01); *H01L 2224/37011* (2013.01); *H01L 2224/82101* (2013.01); *H01L 2924/10272* (2013.01); *H01L 2924/1033* (2013.01); *H01L 2924/1301* (2013.01); *H01L 2924/13055* (2013.01); *H01L 2924/13091* (2013.01)

(56) References Cited

U.S. PATENT DOCUMENTS

| | | | | |
|---|---|---|---|---|
| 6,989,593 | B2 * | 1/2006 | Khan | H01L 23/50 |
| | | | | 257/784 |
| 7,719,851 | B2 | 5/2010 | Tuominen et al. | |
| 8,021,927 | B2 * | 9/2011 | Khan | H01L 23/3128 |
| | | | | 438/122 |
| 10,529,576 | B2 * | 1/2020 | Kurose | H01L 23/3185 |
| 2015/0054159 | A1 | 2/2015 | Hoegerl et al. | |
| 2015/0249043 | A1 | 9/2015 | Elian et al. | |
| 2015/0255380 | A1 | 9/2015 | Chen | |
| 2016/0167132 | A1 | 6/2016 | Panat | |
| 2016/0358897 | A1 | 12/2016 | Albers et al. | |
| 2017/0309549 | A1 | 10/2017 | Wachtler et al. | |
| 2019/0057874 | A1 | 2/2019 | Kurose | |
| 2019/0110367 | A1 | 4/2019 | Gavagnin et al. | |
| 2019/0393117 | A1 | 12/2019 | Vockenberger | |
| 2020/0013723 | A1 | 1/2020 | Fuergut et al. | |

FOREIGN PATENT DOCUMENTS

| | | | | | |
|---|---|---|---|---|---|
| CN | 110416179 | A | | 11/2019 | |
| DE | 102014203309 | A1 | | 8/2015 | |
| EP | 3300105 | A1 | | 3/2018 | |
| EP | 3589087 | A1 | | 1/2020 | |
| JP | 2707909 | | * | 2/1998 | H01L 24/11 |
| JP | H11040936 | | * | 2/1999 | H01L 24/11 |
| KR | 101739683 | B1 | | 5/2017 | |
| KR | 20170071791 | A | | 6/2017 | |
| WO | 2018060265 | A1 | | 4/2018 | |
| WO | 2018134495 | A1 | | 7/2018 | |
| WO | 2018216002 | A1 | | 11/2018 | |
| WO | 2019063533 | A1 | | 4/2019 | |

* cited by examiner

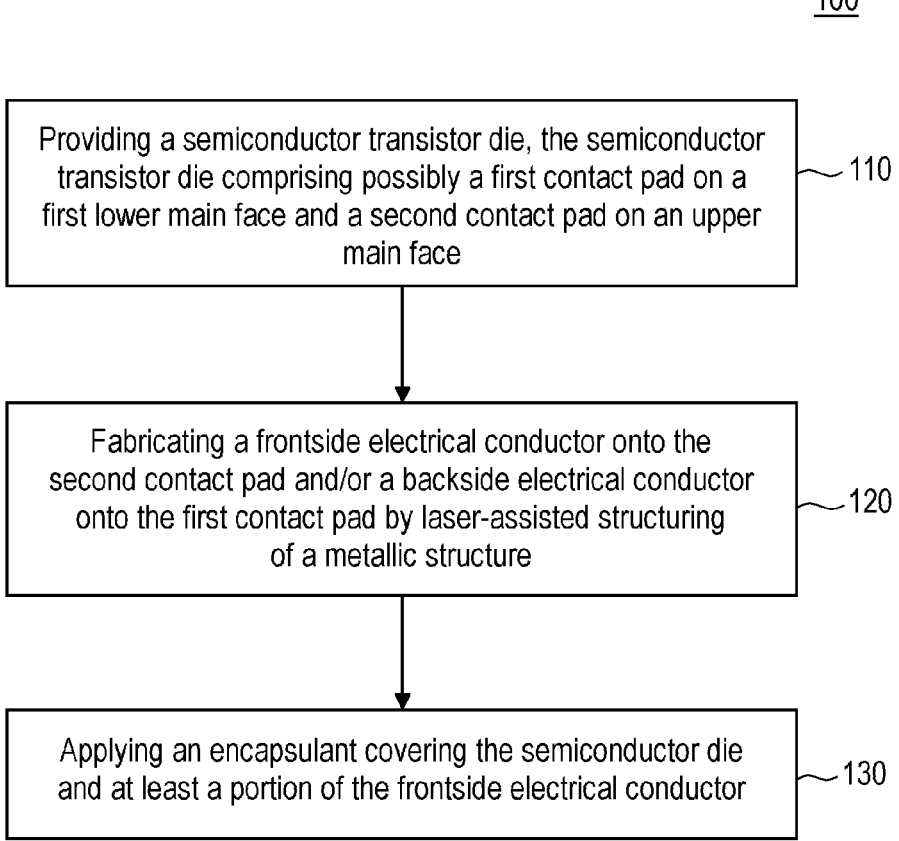

<u>100</u>

Providing a semiconductor transistor die, the semiconductor transistor die comprising possibly a first contact pad on a first lower main face and a second contact pad on an upper main face    ⌐110

Fabricating a frontside electrical conductor onto the second contact pad and/or a backside electrical conductor onto the first contact pad by laser-assisted structuring of a metallic structure    ⌐120

Applying an encapsulant covering the semiconductor die and at least a portion of the frontside electrical conductor    ⌐130

SEMICONDUCTOR DIE PACKAGE

TECHNICAL FIELD

The present disclosure is related to a method for fabricating a semiconductor die package and to a semiconductor die package.

BACKGROUND

In the field of semiconductor power device fabrication an increasing problem is the efficient dissipation of the heat produced by the power device. This problem is further exacerbated by the increasing miniaturization and density of semiconductor power devices. Wide bandgap semiconductor like, for example, SiC or GaN devices within TO packages do have an effective bottom-side cooling, especially for thick leadframe thicknesses. Nevertheless, it has been found out during (reliability) short-circuit tests, that the surface temperature exceeds the melting point of the layer stack, and mold compound degradation may occur due to overheating since the heat dissipation is not efficient enough. A double-side cooling (top and bottom side) can solve this problem. While bottom side cooling is state of the art, the topside cooling underlies some challenges, which are generated by design-rule limitations, for instance up to 1000 μm edge termination due to electro fields. If additionally a 500 μm clearance around the source pad is required for clip soldering, the remaining source pad area for cooling becomes very small for small (shrinked) chip sizes and/or suitable clips become a quite expensive solution for interconnect of the source/emitter and thermomechanical stress comes to a limit.

A further problem of the increasing miniaturization of semiconductor power devices, in particular wide band gap semiconductor power devices like, for example, SiC or GaN power devices, is to conduct high amounts of electric current out of the power devices. A small source pad area is thus not only a problem of insufficient heat dissipation but also a problem of a too low electric current as the frontside interconnect cannot handle a high current output. In addition to that, wide bandgap semiconductors are known to be capable to provide rather fast switching speeds of, for example, >100 kHz. In case of high switching speeds, it is important to provide electrical conductors of low inductances. Therefore, it is desirable to fabricate a frontside and backside interconnect of a low inductance.

SUMMARY

A first aspect of the present disclosure is related to a method for fabricating a semiconductor die package, the method comprising providing a semiconductor transistor die, the semiconductor transistor die comprising a first contact pad on a first lower main face and possibly a second contact pad on an upper main face, fabricating a frontside electrical conductor onto the second contact pad and possibly a backside electrical conductor onto the first contact pad, and applying an encapsulant covering the semiconductor die, and at least a portion of the frontside electrical conductor, wherein the frontside electrical conductor and/or the backside electrical conductor is fabricated by laser-assisted structuring of a metallic structure.

A second aspect of the present disclosure is related to a semiconductor die package, comprising a semiconductor transistor die comprising possibly a first contact pad on a first lower main face and/or a second contact pad on an upper main face, an electrical conductor disposed on the second contact pad and fabricated by laser-assisted structuring of a metallic material, and an encapsulant covering the semiconductor die, and at least a portion of the electrical conductor.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of the embodiments will be readily appreciated as they become better understood by reference to the following detailed description.

The elements of the drawings are not necessarily to scale relative to each other. Like reference numerals designate corresponding similar parts.

FIG. 1 shows a flow diagram for illustrating a method for fabricating a semiconductor die package according to the first aspect.

DETAILED DESCRIPTION

Figure 2A:
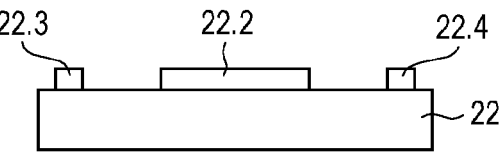
FIGS. 2A through 2F illustrate an example of a method for fabricating a semiconductor die package according to the first aspect.

In the following detailed description, reference is made to the accompanying drawings, which form a part hereof, and in which is shown by way of illustration specific embodiments in which the disclosure may be practiced. In this regard, directional terminology, such as "top", "bottom", "front", "back", "leading", "trailing", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present disclosure. The following detailed description, therefore, is not to be taken in a limiting sense, and the scope of the present disclosure is defined by the appended claims.

It is to be understood that the features of the various exemplary embodiments described herein may be combined with each other, unless specifically noted otherwise.

As employed in this specification, the terms "bonded", "attached", "connected", "coupled" and/or "electrically connected/electrically coupled" are not meant to mean that the elements or layers must directly be contacted together; intervening elements or layers may be provided between the "bonded", "attached", "connected", "coupled" and/or "electrically connected/electrically coupled" elements, respectively. However, in accordance with the disclosure, the above-mentioned terms may, optionally, also have the specific meaning that the elements or layers are directly contacted together, i.e., that no intervening elements or layers are provided between the "bonded", "attached", "connected", "coupled" and/or "electrically connected/electrically coupled" elements, respectively.

Further, the word "over" used with regard to a part, element or material layer formed or located "over" a surface may be used herein to mean that the part, element or material layer be located (e.g., placed, formed, deposited, etc.) "indirectly on" the implied surface with one or more additional parts, elements or layers being arranged between the implied surface and the part, element or material layer. However, the word "over" used with regard to a part, element or material layer formed or located "over" a surface may, optionally, also have the specific meaning that the part, element or material layer be located (e.g., placed, formed, deposited, etc.) "directly on", e.g., in direct contact with, the implied surface.

FIG. 1 shows a flow diagram for illustrating a method for fabricating a semiconductor die package according to the first aspect.

According to FIG. 1, the method 100 for fabricating a semiconductor die package comprises providing a semiconductor transistor die, the semiconductor transistor die comprising possibly a first contact pad on a first lower main face and/or a second contact pad on an upper main face (110), fabricating a frontside electrical conductor onto the second contact pad and possibly also a backside electrical conductor onto the first contact pad (120), and applying an encapsulant covering the semiconductor die, and at least a portion of the frontside electrical conductor (130).

According to an example of the method 100 of FIG. 1, fabricating the frontside electrical conductor and/or the backside electrical conductor comprises:

i. Depositing a metallic material onto the second contact pad and/or the first contact pad; and ii. Irradiating at least a portion of the metallic material with a laser beam.

According to a further example thereof, the method further comprises repeating steps i. and ii. by applying further metallic material onto the fabricated metallic structure and irradiating at least a portion of the further metallic material with the laser beam. Thereafter the steps i. and ii. can be repeated as many times as is required in order to obtain a desired structure of the electrical connector. The method can therefore be called an additive manufacturing method.

According to a further example thereof, the method further comprises a post-process of conditioning the metallic material after laser-assisted structuring. Such post-process may include, for example, a heat treatment for annealing the metallic material so that crystal defects can be healed and crystal grain sizes of the metallic material can be optimized. Also, possible voids or defects in the metallic material can be controlled, in particular the number of voids or defects can be reduced.

The latter can at best be explained by means of FIGS. 2A through 2F which show respective schematic cross-sectional representations of a semiconductor die and a structure to be built up on a contact pad thereof. It should be mentioned that FIGS. 2A through 2F relate to laser-assisted fabrication of a frontside electrical conductor on the second upper surface of the semiconductor die. The same procedure can be performed in addition or alternatively with the fabrication of a backside electrical conductor on the first lower surface of the semiconductor die.

FIG. 2A shows a semiconductor die 22 comprising a first upper main face and a second lower main face opposite to the first upper main face, and side faces connecting the first and second main face with each other, and contact pads 22.2, 22.3, and 22.4 disposed on the first upper main face. The semiconductor die 22 can be an IGBT or MOSFET die and the contact pad 22.2 can be a source or emitter contact pad and the contact pads 22.3 and 22.4 can be, for example, a gate contact pad, a current sense contact pad, or a temperature sense contact pad, respectively. It should be mentioned that it is also possible to apply one or more additional metal layers onto the contact pads in order to increase the stress resistance of the contact pads against the laser assisted structuring process.

Figure 2B:
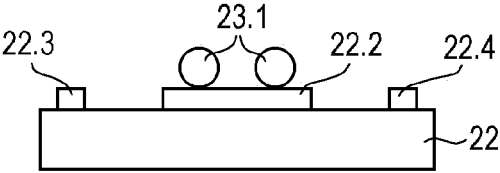

FIG. 2B shows the semiconductor die 22 after applying a first amount of a metallic material 23.1 as, for example, copper onto an upper surface of the source contact pad 22.2. As shown in FIG. 2B, the metallic material can be applied in the form of portions like balls or blocks. However, also other methods of applying the metallic material can be used as will be shown and explained in connection with FIG. 3.

Anyway, the metallic material can be applied directly onto the upper surface of the source contact pad 22.2 and/or the first contact pad without any solder layer or other intermediate layer. As an exception thereof, in special cases a barrier layer or a barrier layer stack including two or more barrier layers can be applied before building up the structure. This will be explained in some more detail below.

Figure 2C:
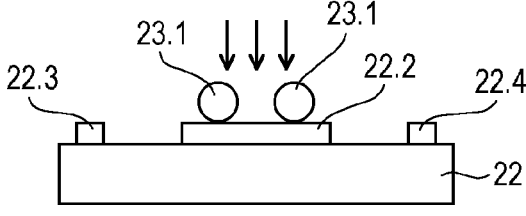

FIG. 2C shows the semiconductor die 22 during irradiating the metallic material with an intense laser beam as indicated by the arrows. The laser source can, for example, be an infrared laser as, for example, a Nd:YAG laser emitting radiation in the infrared spectrum, in particular at a wavelength of 1064 nm. The laser irradiation heats up the metallic material 23.1 and makes it melt so that the portions of the metallic material 23.1 flow into each other and after cooling and solidifying will form a uniform and coherent block of metallic material.

Figure 2D:
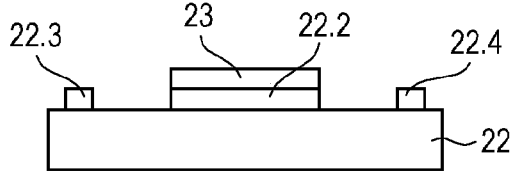

FIG. 2D shows the semiconductor die 22 after finishing the laser irradiation. As a result, the deposited metallic material 23.1 has turned into a uniform and coherent block 23 of metallic, in particular copper material.

Figure 2E:
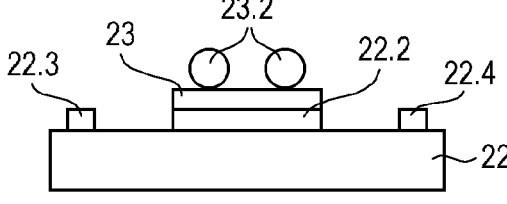

FIG. 2E shows the semiconductor die 22 after applying a second amount of a metallic material 23.2 onto an upper surface of the fabricated metallic material 23. After that a new laser irradiation for irradiating the second amount of metallic material 23.2 is carried out in the same way as was shown and explained in connection with FIG. 2C and is here not being shown again.

Figure 2F:
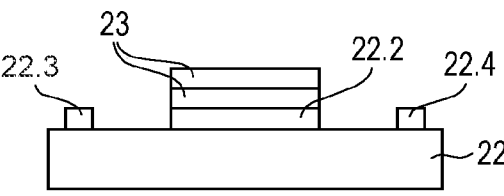

FIG. 2F shows the semiconductor die 22 after finishing this new laser irradiation. As a result, the deposited metallic material 23.2 has also turned into a uniform and coherent block 23 of metallic, in particular copper material.

In such a way, that is by successively repeating the steps of applying metallic material and thereafter irradiating it with the laser beam, a more or less complex 3D structure can be built up onto the contact pads.

According to an example of the method as shown in FIG. 1 or 2A-2F, the method 100 can be carried out in such a way that the metallic structure can be built up in such a way that its lateral dimensions increase whilst growing the structure. In particular, it is possible to increase the lateral dimensions in each step of applying a further amount of metallic material onto the structure. In this way it is possible to build up a massive 3D structure for an improved heat dissipation in combination with low inductance even when starting from a rather small-sized contact pad.

As further advantages, the present disclosure offers the possibility of an extension of the pitch of contact pads on the upper surface of the semiconductor die and/or the possibility of arranging further contact pads. In general, the present disclosure allows for relaxing the design rules. Furthermore, it provides more robustness against z-height-variation due to the compressibility and also some spring force effect of the metallic structure. The metallic material can be freely selected whilst copper is preferred. Aspect-ratio and fan-out-geometry can also be optional. The method of the present disclosure can further be used for a software defined manufacturing of metallic products and structures, also for products with small number of quantities. As a further advantage of the present disclosure, the method allows to fabricate metallic structures with rounded edges in contrast to other methods like, for example, punching which in general results in rather sharp edges. Rounded corners are very important for high-voltage applications as they can prevent high electrical fields in the vicinity of corners or edges.

It should be noted further that this method can be applied for semiconductor chips of any kind of semiconductor material. The method is, however, particularly interesting for wide bandgap semiconductor dies, like, for example, SiC semiconductor dies, or GaN semiconductor dies, in particular power semiconductor dies thereof as they are often very small so that also the contact pads are very small. In case of small contact pads, it becomes very advantageous to build thick interconnect structures thereupon for dissipating the heat generated by the SiC or GaN power die. The method can also be further applied for multi die applications, i.e., for two or more semiconductor dies and in particular for fabricating electrical interconnects between the semiconductor dies.

According to an example of the method as shown in FIG. 1 or 2A-2F, the method 100 further comprises applying the encapsulant such that an upper surface of the metallic structure is at least in part not covered by the encapsulant. This can be very advantageous as in such a case a further heatsink can be applied on top of the exposed metallic structure allowing an efficient double-side cooling. Alternatively or in addition to that, an active cooling structure could be built into the upper surface of the metallic structure. For example, a cooling channel could be formed into the upper surface, the cooling channel being connected with an inlet and outlet so that a cooling medium could be supplied to the cooling channel. All these measures and features can also be employed when forming a backside electrical interconnect.

According to an example of the method as shown in FIG. 1 or 2A-2F, the semiconductor transistor die comprises one or more further contact pads on the second main face, wherein the method further comprises fabricating an electrical conductor also on one or more of the further contact pads by laser-assisted structuring of metallic structures. An example thereof will also be shown later.

According to an example of the method as shown in FIG. 1 or 2A-2F, the method further comprises disposing a barrier layer or a barrier layer stack including two or more barrier layers onto the second contact pad and/or the first contact pad before fabricating the metallic structure. Dependent on the chosen metallization it can be necessary or desirable to implement such a barrier layer between the metallization material and the upper surface of the semiconductor die. Suitable thin layers could be for example Ti, TiN, Ta, TaN, TiW, W, or stacks of these materials.

According to an example of the method of the first aspect, it is also possible that the semiconductor die comprises a contact pad on the first lower main surface and that a backside interconnect is fabricated on this contact pad. In such a case it can be that laser assisted structuring is applied with either one of the frontside or the backside interconnect or with both of them.

According to an example of the method of the first aspect, the method further comprises providing a die carrier and disposing the semiconductor die onto the die carrier. The semiconductor die can, for example, be disposed onto the die carrier before fabricating the frontside electrical connector by laser-assisted structuring and/or after fabricating the backside electrical connector by laser-assisted structuring of a metallic structure.

Figure 3:
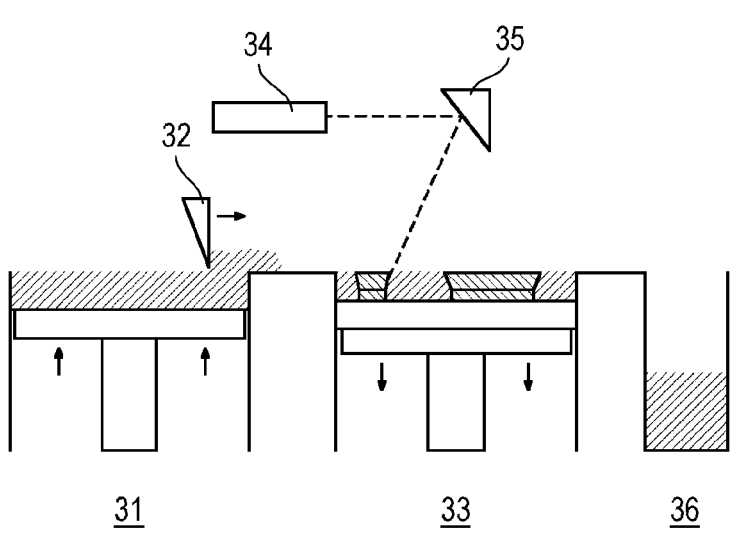
FIG. 3 shows an example of an apparatus for carrying out a method for fabricating a semiconductor die package according to the first aspect.

FIG. 3 shows an example of an apparatus for carrying out a method for fabricating a semiconductor die package according to the first aspect.

The apparatus 30 as shown in FIG. 3 is based on supplying the metallic material in powder form. In particular, the apparatus 30 comprises a powder feed member 31 in which a larger quantity of metal powder is disposed on a platform which platform can be continuously moved upwards. Above the platform a squeegee 32 conveys a portion of the powder towards a build platform 33 where it can be deposited onto the contact pad or a yet developed metallic structure with a given geometry.

It can also be that balls or blocks of the metallic material are thrown onto the surface of the contact pad or the die carrier and are then on-the-flight melted by the impinging laser beam.

The apparatus 30 further comprises a laser source 34 and a mirror 35 or other kind of deflection unit for deflecting the laser beam onto at least a portion of the metal powder in the build platform 33. The mirror 35 can be rotatable to deflect the laser beam in any way and on any desired regions of the metallic powder. The apparatus 30 further comprises an overflow container 36 for collecting up unused metallic powder.

Figure 4:
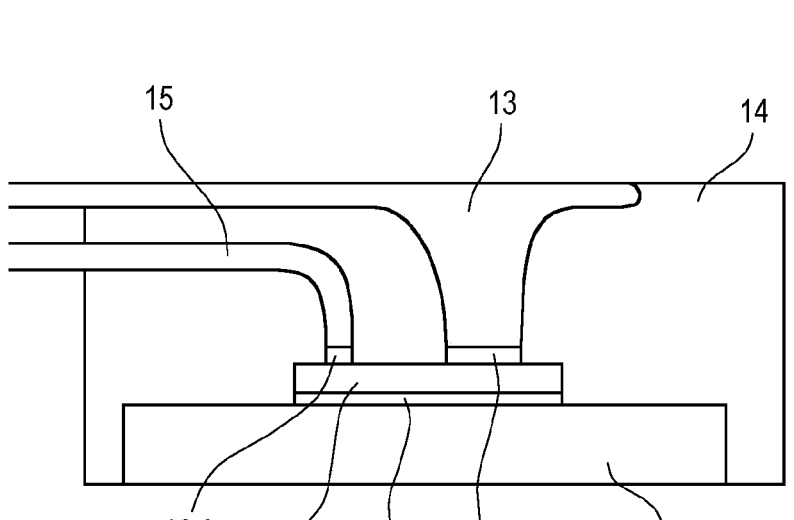
FIG. 4 shows an example of a semiconductor die package according to the second aspect.

FIG. 4 shows an example of a semiconductor die package according to the second aspect.

The semiconductor die package 10 of FIG. 4 comprises a die carrier 11, a semiconductor transistor die 12 disposed on the die carrier 11, the semiconductor transistor die 12 comprising a first contact pad 12.1 on a first lower main face and a second contact pad 12.2 on an upper main face, an electrical conductor 13 disposed on the second contact pad 12.2 and fabricated by laser-assisted structuring of a metallic material, and an encapsulant 14 covering the die carrier 11, the semiconductor die 12, and at least a portion of the electrical conductor 13.

According to an example of the semiconductor die package 10 of FIG. 4, the electrical conductor 13 is directly connected with the second contact pad 12.2 with no further layer in between.

According to another example of the semiconductor die package of FIG. 4, a barrier layer is disposed between second contact pad and the upper main face of the semiconductor die 12. According to a further example thereof, the barrier layer comprises one of Ti, TiN, Ta, TaN, TiW, W, or any kind of stacks of these materials.

According to an example of the semiconductor die package of FIG. 4, the semiconductor die 11 is a siC die.

According to an example of the semiconductor die package of FIG. 4, the semiconductor transistor die 11 is a power semiconductor transistor die, in particular a power IGBT die or a power MOSFET die, or a thyristor die.

According to another example of the semiconductor die package of FIG. 4, an upper surface of the metallic structure 13 is at least in part not covered by the encapsulant 14. This allows for efficient double-side cooling by applying a heatsink onto the upper surface of the metallic structure 13.

According to another example of the semiconductor die package of FIG. 4, the semiconductor die package 10 further comprises the semiconductor transistor die 12 comprising one or more further contact pads 12.3 on the second main face, and an electrical conductor 15 disposed on one or more of the further contact pads 12.3 and also fabricated by laser-assisted structuring of metallic structures.

According to an example of the semiconductor die package of FIG. 4, the electrical conductor 13 can be formed homogeneous or continuous or coherent such as shown in the example of FIG. 4. That is, also a portion of the electrical conductor 13 extending beyond the package, i.e., beyond a side face of the encapsulant 14 can still be formed by the additive fabrication method. However, it can also be the case that only a first portion of the electrical conductor, namely a first portion adjacent the contact pad 12.2 is fabricated by the additive fabrication method, and further portions of the electrical conductor 13 are produced by other methods. This holds true as well for the electrical connector 15. A respective example will be shown and explained below.

Figure 5:
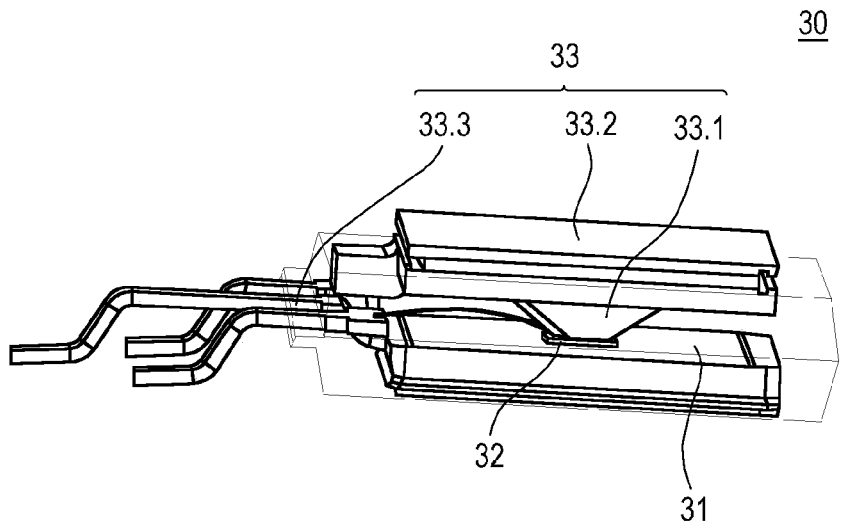
FIG. 5 shows a further example of a semiconductor die package according to the second aspect in which example a clip-like structure has been produced by the method according to the first aspect.

FIG. 5 shows a further example of a not yet packaged semiconductor device in which example a clip-like structure has been produced by the method according to the first aspect.

The die carrier can be either one of a portion of a leadframe, a directed copper bond (DCB), an active metal braze (AMB), or an isolated metal substrate (IMS).

The semiconductor die package 30 of FIG. 5 comprises a die carrier 31, a semiconductor transistor die 32 disposed on the die carrier 31, the semiconductor transistor die 32 comprising a first contact pad (not visible) on a first lower main face and a second contact pad (not visible) on an upper main face, an electrical conductor 33 disposed on the second contact pad and fabricated in part by laser-assisted structuring of a metallic material.

After applying an encapsulant so that it covers the die carrier 31, the semiconductor die 32, and at least a portion of the electrical conductor 33, the result will be a semiconductor die package according to the second aspect. It should be noted that the semiconductor die package may be configured such that it contains single discrete semiconductor dies as well as modules containing two or more semiconductor dies like, for example, power modules and intelligent power modules. The encapsulant can then be a resin, in particular an epoxy resin, as well as a silicone material.

The electrical conductor 33 is composed of three portions, namely a first portion 33.1 formed directly on the contact pad, a second portion 33.2 which is the clip-like structure, and a third portion 33.3 which may form an external contact. More specifically, the first portion 33.1 may have been formed by the additive fabrication method, and also the second portion 33.2, namely the clip-like structure, may have also been formed by the additive fabrication method, and the third portion 33.3, in particular the external connector 33.3, may be part of a leadframe. In particular also the die carrier 31 may be part of a leadframe, in particular of the same leadframe which the external contact 33.3 is a part of.

The previous examples as shown in FIGS. 4 and 5 presented devices in which the additive fabrication method is used to fabricate metallic structures that are homogeneous and coherent in themselves. In the following it will be shown that also other types of structures can be produced with the additive fabrication method.

Figure 6:
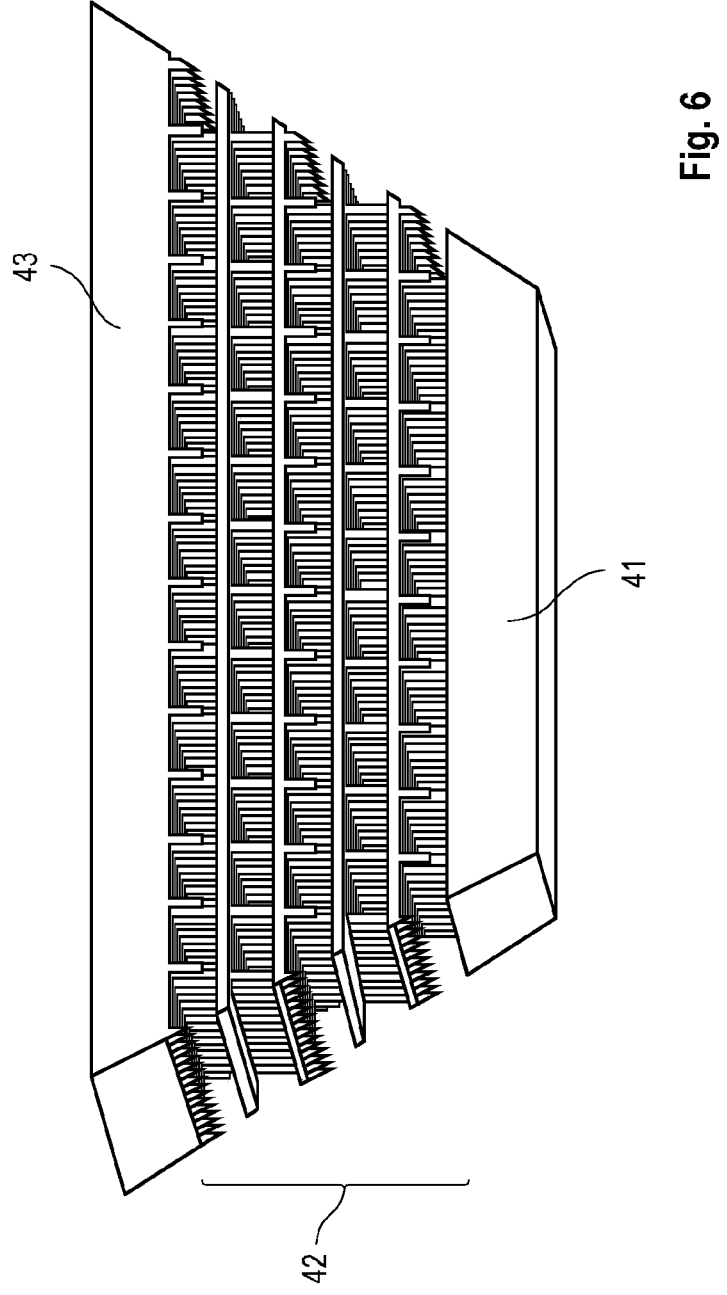
FIG. 6 shows an example of a 3D structure produced by the method according to the first aspect.

FIG. 6 shows an example of a particular 3D structure produced by the method according to the first aspect. A specific feature of the 3D structure 40 shown therein is that it is comprised of a structure in a portion of which the metallic material does not fill the entire space above the contact pad of the semiconductor die, but only selective areas of the available space. More specifically, the 3D structure shown comprises a lattice structure, i.e., any possible kind of an openwork framework consisting of a criss-crossed pattern of strips or bars of metallic material. The lattice structure is formed by crossing the strips or bars to form a grid or weave. More specifically, the 3D structure 40 shown in FIG. 6 comprises a first contiguous portion 41 onto which is applied a lattice portion 42 which is again followed by a further contiguous portion 43.

The use of such structures as shown in FIG. 6 can in particular be advantageous when a massive heatsink is intended to be disposed on an upper surface of the metallic structure. If in such a case a homogeneous or continuous metallic structure of the electrical connector is used such is shown in FIG. 4 or 5, then plastic strain may be induced by the heatsink. Plastic strain can be observed by the presence of dislocations or displacements of part of the crystal lattice. Such strain effects can result in unwanted cracking of the material, as is the case with residual plastic strain. All this can be avoided when using a lattice structure of the electrical connector which lattice structure can deform itself without any structural alterations of the metallic material itself taken place.

Example 1 is a method for fabricating a semiconductor die package, the method comprising providing a semiconductor transistor die, the semiconductor transistor die comprising possibly a first contact pad on a first lower main face and a second contact pad on an upper main face, fabricating a frontside electrical conductor onto the second contact pad and possibly also a backside electrical conductor onto the first contact pad, and applying an encapsulant covering the semiconductor die, and at least a portion of the frontside electrical conductor, wherein the frontside electrical conductor and/or the backside electrical conductor is fabricated by laser-assisted structuring of a metallic structure.

In Example 2, the subject matter of Example 1 can optionally further include that fabricating the frontside electrical conductor and/or the backside electrical conductor comprises i. Depositing a metallic material onto the second contact pad and/or the first contact pad, and ii. Irradiating at least a portion of the metallic material with a laser beam.

In Example 3, the subject matter of Example 1 or 2A-2F can optionally further comprises repeating steps i. and ii. by applying further metallic material onto the fabricated metallic structure and irradiating at least a portion of the further metallic material with the laser beam.

In Example 4, the subject matter of any one of the preceding Examples can optionally further include that the metallic material is deposited in the form of a metallic powder or metallic balls or blocks.

In Example 5, the subject matter of any one of the preceding Examples can optionally further include that before fabricating the electrical conductor no layer, in particular no solder layer, is deposited onto the second contact pad and/or the first contact pad.

In Example 6, the subject matter of any one of the preceding Examples can optionally further include that the semiconductor die is one or more of a wide bandgap semiconductor die, a SiC die, or a GaN die.

In Example 7, the subject matter of any one of the preceding Examples can optionally further include that the semiconductor transistor die is a power semiconductor transistor die, in particular a power IGBT die or a power MOSFET die, or a thyristor die.

In Example 8, the subject matter of any one of the preceding Examples can optionally further comprises applying the encapsulant such that an upper surface of the metallic structure is at least in part not covered by the encapsulant.

In Example 9, the subject matter of any one of the preceding Examples can optionally further include that the semiconductor transistor die comprises one or more further contact pads on the second main face, wherein the method further comprises fabricating an electrical conductor also on one or more of the further contact pads by laser-assisted structuring of metallic structures.

In Example 10, the subject matter of any one of the preceding Examples can optionally further comprise disposing a barrier layer or a barrier layer stack including two or more barrier layers onto the second contact pad and/or the first contact pad before fabricating the metallic structure.

In Example 11, the subject matter of any one of the preceding Examples can optionally further comprise providing a die carrier and disposing the semiconductor die onto the die carrier.

Example 12 is a semiconductor die package, comprising a semiconductor transistor die, the semiconductor transistor die comprising possibly a first contact pad on a first lower main face and/or a second contact pad on an upper main face, an electrical conductor disposed on the second contact pad and fabricated by laser-assisted structuring of a metallic material, and an encapsulant covering the semiconductor die, and at least a portion of the electrical conductor.

In Example 13, the subject matter of Example 12 can optionally further comprise a die carrier, wherein the semiconductor die is disposed on the die carrier.

In Example 14, the subject matter of any one of the Examples 12 or 13 can optionally further include that the electrical conductor is directly connected with the second contact pad with no further layer in between.

In Example 15, the subject matter of any one of the Examples 12 to 14 can optionally further include that the semiconductor die is one or more of a wide bandgap semiconductor die, a SiC die, or a GaN die.

In Example 16, the subject matter of any one of the Examples 12 to 15 can optionally further include that the semiconductor transistor die (11; 31) is a power semiconductor transistor die, in particular a power IGBT die or a power MOSFET die, or a thyristor die.

In Example 17, the subject matter of any one of the Examples 12 to 16 can optionally further include that an upper surface of the electrical conductor is at least in part not covered by the encapsulant.

In Example 18, the subject matter of any one of the Examples 12 to 17 can optionally further comprise the semiconductor transistor die comprising one or more further contact pads on the second main face, and an electrical conductor on one or more of the further contact pads fabricated by laser-assisted structuring of metallic structures.

In addition, while a particular feature or aspect of an embodiment of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments of the disclosure may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A semiconductor die package, comprising:
   a semiconductor transistor die, the semiconductor transistor die comprising a contact pad on an upper main face;
   an electrical conductor disposed on the contact pad, the electrical conductor comprising a laser irradiated metallic material that forms a uniform and coherent block; and
   an encapsulant covering the semiconductor die and at least a portion of the electrical conductor.

2. The semiconductor die package of claim 1, further comprising:
   a die carrier,
   wherein the semiconductor die is disposed on the die carrier.

3. The semiconductor die package of claim 1, wherein the electrical conductor is directly connected with the contact pad with no further layer in between.

4. The semiconductor die package of claim 1, wherein a barrier layer is disposed between the contact pad and the upper main face of the semiconductor die.

5. The semiconductor die package of claim 4, wherein the barrier layer comprises one of Ti, TiN, Ta, TaN, TiW, and W or a stack of any of Ti, TiN, Ta, TaN, TiW, and W.

6. The semiconductor die package of claim 1, wherein the semiconductor die is one or more of a wide bandgap semiconductor die, a SiC die, or a GaN die.

7. The semiconductor die package of claim 1, wherein the semiconductor transistor die is a power IGBT die, or a power MOSFET die, or a thyristor die.

8. The semiconductor die package of claim 1, wherein an upper surface of the electrical conductor is at least in part not covered by the encapsulant.

9. The semiconductor die package of claim 8, further comprising a heatsink applied to the upper surface of the metallic structure.

10. The semiconductor die package of claim 1, further comprising:
    a further contact pad on the second main face of the semiconductor transistor die; and
    an electrical conductor on the further contact pad and fabricated by laser-assisted structuring of metallic structures.

11. The semiconductor die package of claim 1, wherein a portion of the electrical conductor extends beyond a side face of the encapsulant.

12. The semiconductor die package of claim 11, wherein the portion of the electrical conductor that extends beyond the side face of the encapsulant is homogeneous with a portion of the electrical conductor within the encapsulant and fabricated by the same laser-assisted structuring of the metallic material.

13. The semiconductor die package of claim 11, wherein the portion of the electrical conductor that extends beyond the side face of the encapsulant is fabricated from a different metallic material than a portion of the electrical conductor within the encapsulant.

14. The semiconductor die package of claim 1, wherein the electrical conductor comprises a first portion formed directly on the contact pad, a second portion adjoining the second portion and having a clip-like structure, and a third portion forming an external contact.

15. The semiconductor die package of claim 14, wherein both the first portion and the second portion are fabricated by the laser-assisted structuring of the metallic material, and wherein the third portion is part of a leadframe.

16. The semiconductor die package of claim 1, wherein the electrical conductor comprises a first contiguous portion, a lattice portion on the first contiguous portion, and a further contiguous portion on the lattice portion, and wherein the metallic material does not fill the entire space in the lattice portion.

17. The semiconductor die package of claim 16, wherein the lattice portion comprises a crisscrossed pattern of strips or bars of the metallic material.

18. The semiconductor die package of claim 1, further comprising:
  a first contact pad on a lower main face of the semiconductor transistor die; and
  a backside electrical conductor disposed on the first contact pad, the backside electrical conductor comprising a laser irradiated metallic material that forms a uniform and coherent block.

* * * * *